(12) United States Patent
Desouza et al.

(10) Patent No.: US 10,331,185 B2
(45) Date of Patent: *Jun. 25, 2019

(54) TEMPERATURE TREND CONTROLLED COOLING SYSTEM

(71) Applicant: Dell Products L.P., Round Rock, TX (US)

(72) Inventors: Marcelo Desouza, Austin, TX (US); Arun Subash Manickam, Tamilnadu (IN)

(73) Assignee: Dell Products L.P., Round Rock, TX (US)

( * ) Notice: Subject to any disclaimer, the term of this patent is extended or adjusted under 35 U.S.C. 154(b) by 59 days.

This patent is subject to a terminal disclaimer.

(21) Appl. No.: 15/363,082

(22) Filed: Nov. 29, 2016

(65) Prior Publication Data
US 2017/0075400 A1 Mar. 16, 2017

Related U.S. Application Data

(63) Continuation of application No. 14/198,282, filed on Mar. 5, 2014, now Pat. No. 9,578,787.

(51) Int. Cl.
G06F 1/00 (2006.01)
G06F 1/20 (2006.01)
H05K 7/20 (2006.01)
G05D 23/19 (2006.01)

(52) U.S. Cl.
CPC ......... *G06F 1/206* (2013.01); *G05D 23/1917* (2013.01); *G05D 23/1919* (2013.01); *H05K 7/20836* (2013.01)

(58) Field of Classification Search
CPC ........................... H05K 7/20836; G01K 13/00
See application file for complete search history.

(56) References Cited

U.S. PATENT DOCUMENTS

| | | |
|---|---|---|
| 5,179,524 A | 1/1993 | Parker et al. |
| 2004/0264125 A1 | 12/2004 | Cheng et al. |
| 2005/0030171 A1 | 2/2005 | Liu et al. |
| 2006/0204271 A1 | 9/2006 | Tai et al. |
| 2007/0297893 A1 | 12/2007 | Alon et al. |
| 2008/0009980 A1 | 1/2008 | Chang et al. |
| 2009/0326884 A1 | 12/2009 | Amemiya et al. |
| 2010/0057259 A1 | 3/2010 | Dawson et al. |
| 2010/0100254 A1 | 4/2010 | Artman et al. |
| 2011/0040532 A1 | 2/2011 | Hamann et al. |

(Continued)

*Primary Examiner* — Christopher E. Everett
(74) *Attorney, Agent, or Firm* — Haynes and Boone, LLP

(57) ABSTRACT

An information handling system (IHS) temperature control system includes a cooling system, a controller coupled to the cooling system, and an IHS coupled to the controller. The IHS includes a temperature status reporting engine that is configured to determine a first temperature of the IHS and determine a second temperature of the IHS subsequent to determining the first temperature. In response to the second temperature being above a first predetermined temperature range, the temperature status reporting engine provides a first signal to the controller to increase cooling provided by the cooling system if the first temperature and the second temperature indicate that a temperature trend of the IHS is not decreasing, and provides a second signal to the controller to maintain cooling provided by the cooling system if the first temperature and the second temperature indicate that the temperature trend of the IHS is decreasing.

20 Claims, 8 Drawing Sheets

(56) References Cited

U.S. PATENT DOCUMENTS

| | | |
|---|---|---|
| 2011/0203785 A1 | 8/2011 | Federspiel et al. |
| 2012/0284216 A1 | 11/2012 | Hamann et al. |
| 2013/0090889 A1 | 4/2013 | Vaidyanathan et al. |
| 2013/0226501 A1 | 8/2013 | Ghosh |
| 2013/0228632 A1 | 9/2013 | Kapoor et al. |
| 2013/0305067 A1 | 11/2013 | Lefurgy et al. |
| 2013/0345893 A1 | 12/2013 | David et al. |
| 2014/0079533 A1 | 3/2014 | Kitano |
| 2015/0257310 A1 | 9/2015 | DeSouza et al. |

| Temperature Determined | Temperature Status Sent | Fan Speed (%PWM) |
|---|---|---|
| 68 | 2 | 30 |
| 69 | 2 | 30 |
| 70 | 2 | 30 |
| 71 | 3 | 35 |
| 72 | 3 | 50 |
| 72 | 3 | 70 |
| 71 | 3 | 100 |
| 70 | 2 | 100 |
| ... | 2 | 100 |
| 51 | 1 | 96 |
| 50 | 1 | 80 |
| 49 | 1 | 60 |
| 48 | 1 | 40 |
| 49 | 1 | 30 |
| 50 | 2 | 30 |
| 51 | | |

322

| Temperature Determined | Temperature Status Sent | Fan Speed (%PWM) |
|---|---|---|
| 68 | 2 | 30 |
| 69 | 2 | 30 |
| 70 | 2 | 30 |
| 71 | 3 | 35 |
| 72 | 3 | 50 |
| 72 | 2 | 80 |
| 71 | 2 | 80 |
| 70 | 2 | 80 |
| ... | 2 | 80 |
| 51 | 1 | 76 |
| 50 | 1 | 60 |
| 49 | 2 | 48 |
| 48 | 2 | 48 |
| 49 | 2 | 48 |
| 50 | 2 | 48 |
| 51 | | |

| Temperature Determined | Temperature Status Sent | Fan Speed (%PWM) |
|---|---|---|
| 68 | 2 | 30 |
| 69 | 2 | 30 |
| 70 | 2 | 30 |
| 71 | 3 | 35 |
| 72 | 3 | 50 |
| 72 | 2 | 70 |
| 71 | 3 | 70 |
| 72 | 3 | 75 |
| 73 | 3 | 90 |
| 74 | 3 | 95 |
| 73 | 2 | 95 |
| 72 | 2 | 95 |
| 71 | 2 | 95 |
| 70 | 2 | 95 |
| 69 | 2 | 95 |
| ... | 2 | 95 |
| 51 | 1 | 75 |
| 50 | 1 | 59 |
| 49 | 1 | 55 |
| 48 | 1 | 51 |
| 47 | 2 | 47 |
| 46 | 2 | 47 |
| 47 | 1 | 47 |
| 48 | 2 | 43 |
| 47 | 2 | 39 |
| 46 | 2 | 39 |
| 47 | 2 | 39 |
| 48 | 2 | 39 |
| 49 | 2 | 39 |
| 50 | 2 | 39 |
| 51 | 2 | 39 |

TEMPERATURE TREND CONTROLLED COOLING SYSTEM

CROSS-REFERENCE TO RELATED APPLICATIONS

This is a Continuation application to U.S. Utility application Ser. No. 14/198,282 filed Mar. 5, 2014, entitled "Temperature Trend Controlled Cooling System," the disclosure of which is incorporated herein by reference in its entirety.

BACKGROUND

The present disclosure relates generally to information handling systems, and more particularly to controlling a cooling system in an information handling system using temperature trends.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHS chassis or racks are sometimes provided to house a plurality of IHSs, and typically include a cooling system for cooling those IHSs. For example, an IHS chassis may house a plurality of a server IHSs, switch IHSs or other networking IHSs, storage IHSs, and/or a variety of other IHSs known in the art, as well as a cooling system for cooling those IHSs. A chassis management controller may be coupled to the IHSs and the cooling systems, and may be configured to receive a temperature status from each of the IHSs and use that temperature status to control the cooling system. The temperature status reported by each of the IHSs is based on temperature thresholds, with the reported temperature status changing when the temperature of the IHS passes those thresholds. The use of temperature thresholds to report a temperature status raises a number of issues, as the conventional actions taken in response to conventionally reported temperature thresholds can result in over-operation of the cooling system when it is not needed by the IHSs, which unnecessarily increases power consumption, component degradation, and noise.

Accordingly, it would be desirable to provide for improved control of cooling systems.

SUMMARY

According to one embodiment, an information handling system (IHS) temperature control system includes a cooling system; a controller coupled to the cooling system; and an IHS coupled to the controller, wherein the IHS includes a temperature status reporting engine that is configured to: determine a first temperature of the IHS; determine a second temperature of the IHS subsequent to determining the first temperature; and in response to the second temperature being above a first predetermined temperature range, provide a first signal to the controller to increase cooling provided by the cooling system if the first temperature and the second temperature indicate that a temperature trend of the IHS is not decreasing, and provide a second signal to the controller to maintain cooling provided by the cooling system if the first temperature and the second temperature indicate that the temperature trend of the IHS is decreasing.

BRIEF DESCRIPTION OF THE DRAWINGS

FIG. 3b is a chart illustrating an embodiment of temperature control using the prior art method of FIG. 3a.

FIG. 4b is a chart illustrating an embodiment of temperature control using the method of FIG. 4a.

FIG. 4c is a chart illustrating an embodiment of temperature control using the method of FIG. 4a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
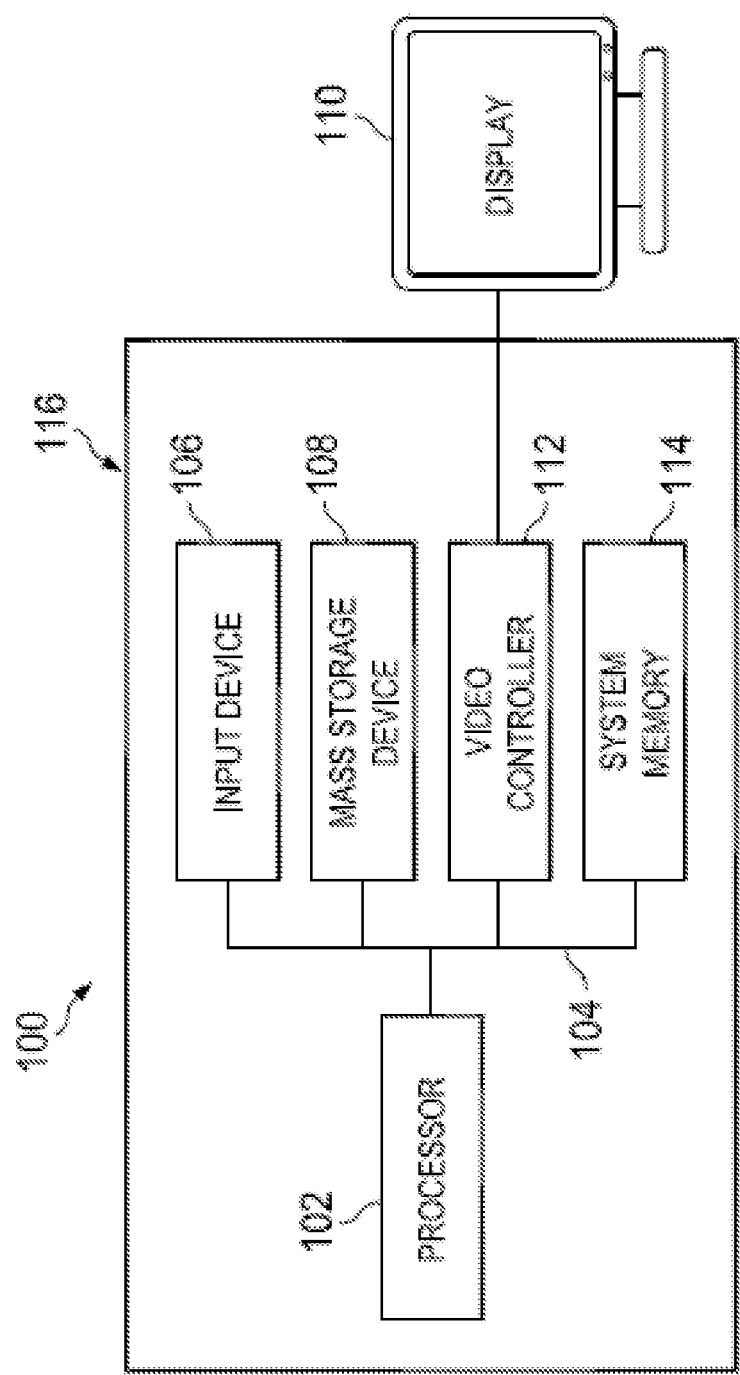
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102. Furthermore, the IHS 100 may include networking devices for communicating with a network (e.g., a Local Area Network (LAN)).

Figure 2:
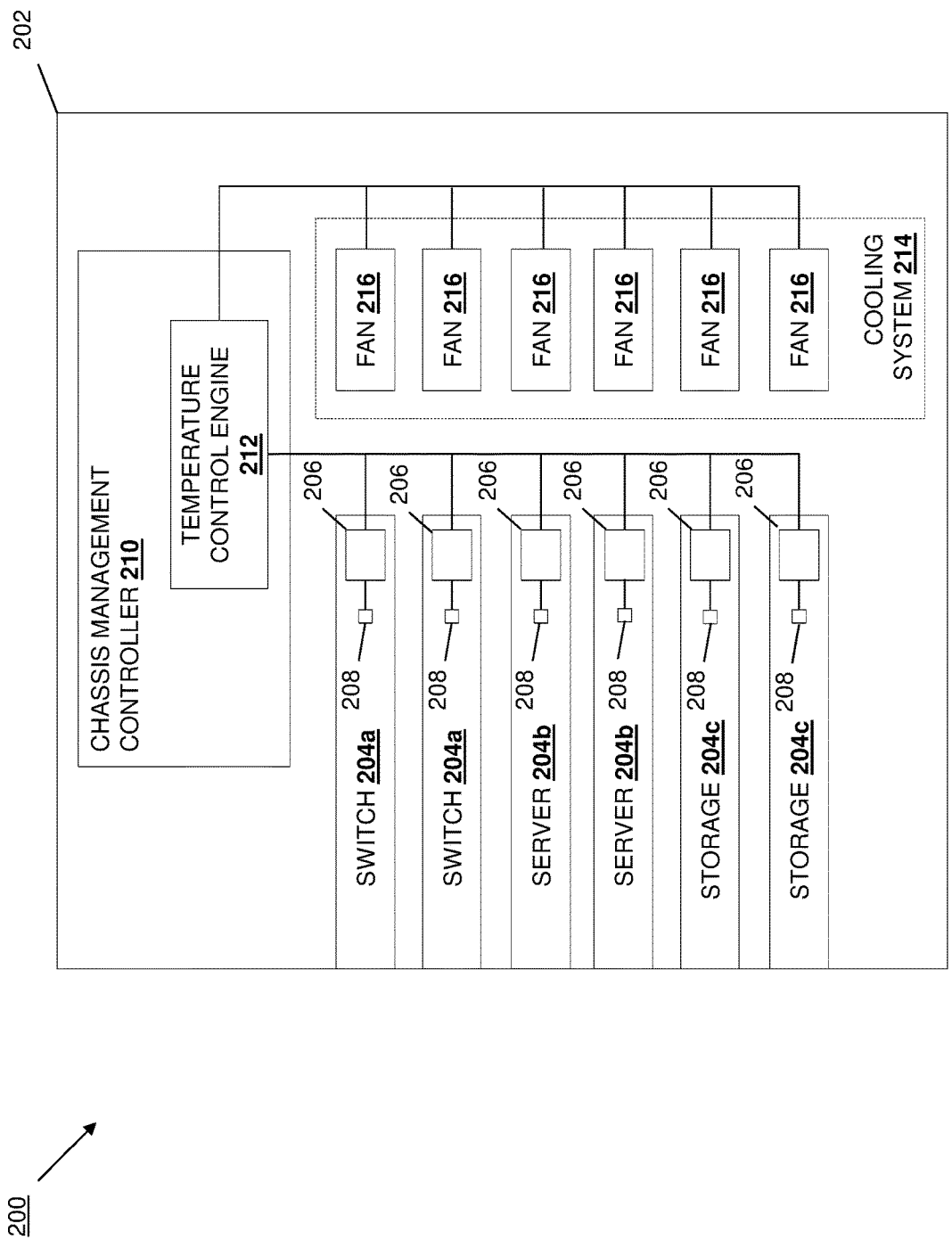
FIG. 2 is a schematic view illustrating an embodiment of an IHS temperature control system.

Referring now to FIG. 2, an embodiment of an IHS temperature control system 200 is illustrated. In the illustrated embodiment, the IHS temperature control system 200 includes an IHS rack 202 that houses the components of the IHS temperature control system 200. However, in other embodiment, the IHS rack 202 may be any IHS enclosure that is configured to house IHSs, controllers, cooling systems, and/or other components known in the art. Furthermore, in some embodiments, the IHS rack 200 may be omitted. A plurality of IHSs 204 are located in the IHS rack 202 and each of the IHSs 204 may be the IHS 100 discussed above with reference to FIG. 1 or may include some or all of the components of the IHS 100. In the illustrated embodiment, the IHSs 204 include a plurality of switch IHSs 204*a*, a plurality of server IHSs 204*b*, and a plurality of storage IHSs 204*c*. Each of the IHSs 204 and the IHS rack 202 may include features for coupling, decoupling, securing, un-securing, and/or otherwise positioning the IHSs 204 in the IHS rack. In an embodiment, the switch IHSs 204*a* may be, for example, Dell Networking MXL switch IHSs available from Dell Inc. of Round Rock, Tex., Dell PowerEdge M I/O Aggregator switch IHSs available from Dell Inc., Dell PowerConnect M8024K switch IHSs available from Dell Inc., and/or a variety of other switch IHSs known in the art. In an embodiment, the server IHSs 204*b* may be Dell PowerEdge rack server IHSs available from Dell Inc., Dell Blade servers available from Dell Inc., and/or a variety of other server IHSs known in the art. In an embodiment, the storage IHSs may be Dell EqualLogic storage IHSs available from Dell Inc., Dell PowerVault storage IHSs available from Dell Inc., and/or a variety of other storage IHSs known in the art. While a few examples of IHSs have been provided, any other IHS, as well as other heat producing devices including IHS components and/or non-IHS heat producing devices, will benefit from the teachings of the present disclosure and are envisioned as falling within its scope.

Each of the IHSs 204 may include a processing system (e.g., the processor 102 discussed above with reference to FIG. 1) that is located in the IHS 204 and that is coupled to a memory system (e.g., the system memory 114 discussed above with reference to FIG. 1) that is located in the IHS 204 and that includes instructions that, when executed by the processing system, cause the processing system to provide a temperature status reporting engine 206 that is configured to perform the functions of the temperature status reporting engines discussed below. Each temperature status reporting engine 206 in the IHSs 204 may be coupled to a temperature sensor 208 (e.g., through a coupling between the temperature sensor 208 and the processing system in that IHS 204) that is located in that IHS 204 and that is configured to measure a temperature of that IHS 204, a temperature of a component of that IHS 204, and/or any temperature that is indicative of the thermal conditions experienced by that IHS 204. Thus, the temperature sensors 208 may be configured to measure an average temperature in their associated IHS 204, the highest temperature component in their associated IHS 204, and/or any other temperature of their associated IHS that is known in the art to dictate the cooling requirements of an IHS.

A chassis management controller 210 is located in the IHS rack 202 and may be the IHS 100 discussed above with reference to FIG. 1 or may include some or all of the components of the IHS 100. The chassis management controller 210 may include a processing system (e.g., the processor 102 discussed above with reference to FIG. 1) that is coupled to a memory system (e.g., the system memory 114 discussed above with reference to FIG. 1) that includes instructions that, when executed by the processing system, cause the processing system to provide a temperature control engine 212 that is configured to perform the functions of the temperature control engines discussed below. The chassis management controller 210 is coupled to each of the IHSs 204, and more specifically, in the illustrated embodiment, the temperature control engine 212 in the chassis management controller 210 is coupled to the temperature status reporting engines 206 in each of the IHSs 204 (e.g., through a coupling between the processing system in the chassis management controller 210 and the processing systems in each of the IHSs 204).

A cooling system 214 is located in the IHS rack 202 and, in the illustrated embodiment, includes a plurality of fans 216. The chassis management controller 210 is coupled to each of the plurality of fans 216, and more specifically, in the illustrated embodiment, the temperature control engine 212 in the chassis management controller 210 is coupled to each of the fans 216 (e.g., through a coupling between the processing system in the chassis management controller 210 and a fan controller in each of the fans 216). In the illustrated embodiment, the cooling system 214 is illustrated as providing a respective fan located adjacent each IHS 204. However, in other embodiments, any number, combination, and positioning of fans and IHSs may be provided and used according to the teachings of the present disclosure. As discussed below, in some embodiments, groups of the IHSs may share one or more of the fans 216, and the chassis management controller 210 may communicate with each of the IHSs 204 in the group to determine how to control the fans 216 associated with that group. In other embodiments, each IHS 204 may communicate with the chassis management controller 210 to control a respective fan 216 that provides cooling to that IHS 204.

Figure 3A:
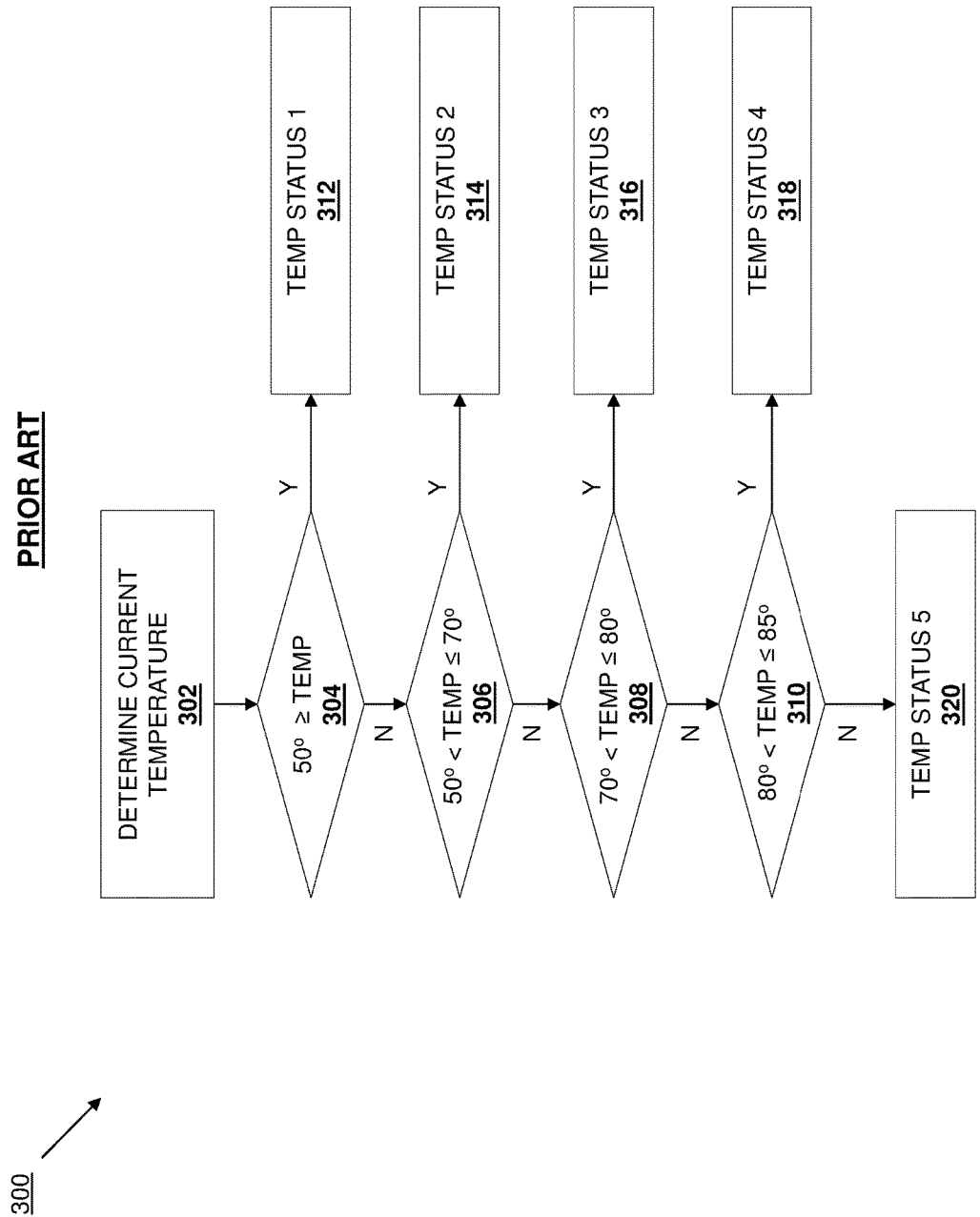
FIG. 3a is a flow chart illustrating an embodiment of a prior art method for providing temperature control.

Referring now to FIG. 3a, a prior art method 300 for providing temperature control using the IHS temperature control system 200 of FIG. 2 is illustrated. In the prior art method 300, the IHSs 204 use temperature thresholds to determine a temperature status that is sent to the chassis management controller 210. The prior art method 300 will be discussed below with reference to a single IHS, but it should be understood each of the IHSs 204 is configured to perform the prior art method 300 during its operation. The prior art method 300 begins at block 302 where the IHS 204 determines a current temperature. The prior art method 300 the proceeds to decision block 304 to determine whether the current temperature is less than or equal to 50° C. If at decision block 304 it is determined that the current temperature is not less than or equal to 50° C., the prior art method 300 proceeds to decision block 306 where it is determined whether the current temperature is greater than 50° C. and less than or equal to 70° C. If at decision block 306 it is determined that the current temperature is not greater than 50° C. and less than or equal to 70° C., the prior art method 300 proceeds to decision block 308 where it is determined whether the current temperature is greater than 70° C. and less than or equal to 80° C. If at decision block 308 it is determined that the current temperature is not greater than 70° C. and less than or equal to 80° C., the prior art method 300 proceeds to decision block 310 where it is determined whether the current temperature is greater than 80° C. and less than or equal to 85° C. Thus, the prior art method 300 involves each IHS 204 determining when its current temperature has cross a plurality of temperature thresholds (e.g., 50° C., 70° C., 80° C., and 85° C.).

The prior art method 300 includes a plurality of temperature statuses, and each of the IHSs 204 may send one of those temperature statuses when its current temperature passes any of the temperature thresholds discussed above. In the prior art method 300, a first temperature status ("TEMP STATUS 1") corresponds to a below normal temperature reading, and is reported by the IHS 204 to the chassis management controller 210 at block 312 in response to determining at decision block 304 that its current temperature has not passed the 50° C. temperature threshold. The chassis management controller 210 is configured to decrease the fan speed of the fans 216 by 4% every 20 seconds in response to the reporting of a TEMP STATUS 1 from the IHS 204. A second temperature status ("TEMP STATUS 2") corresponds to a normal temperature reading, and is reported by the IHS 204 to the chassis management controller 210 at block 314 in response to determining at decision block 306 that its current temperature has passed the 50° C. threshold. The chassis management controller 210 is configured to make no changes to the fan speed of the fans 216 in response to the reporting of a TEMP STATUS 2 from the IHS 204. A third temperature status ("TEMP STATUS 3") corresponds to a warning temperature reading, and is reported by the IHS 204 to the chassis management controller 210 at block 316 in response to determining at decision block 308 that its current temperature has passed the 70° C. threshold. The chassis management controller 210 is configured to increase the fan speed of the fans 216 by 5% every 5 seconds in response to the reporting of a TEMP STATUS 3 from the IHS 204. A fourth temperature status ("TEMP STATUS 4") corresponds to a critical temperature reading, and is reported by the IHS 204 to the chassis management controller 210 at block 318 in response to determining at decision block 310 that its current temperature has passed the 80° C. threshold. The chassis management controller 210 is configured to increase the fan speed of the fans 216 by 20% every 5 seconds in response to the reporting of a TEMP STATUS 4 from the IHS 204. A fifth temperature status ("TEMP STATUS 5") corresponds to a shutdown temperature reading, and is reported by the IHS 204 to the chassis management controller 210 at block 320 in response to determining at decision block 310 that its current temperature has passed the 85° C. threshold. The chassis management controller 210 is configured to shut down the IHS 204 in response to the reporting of a TEMP STATUS 5 from the IHS 204.

Figure 3B:

Referring now to FIG. 3b, a chart 322 is provided to illustrate the deficiencies in the operation of the IHS temperature control system 200 according to the prior art method 300 of FIG. 3a. It has been discovered that when switch IHSs with relatively high power consumption (e.g., Dell Networking MXL switch IHSs, Dell PowerEdge M I/O Aggregator switch IHSs, and Dell PowerConnect M8024K switch IHSs, all available from Dell Inc.) are included in the IHS temperature control system 200 and operate according to the prior art method 300, the fans 216 may oscillate between 30% pulse—width modulation (PWM) and 100% PWM for periods of around 30 minutes, which creates power consumption issues, component degradation issues, and noise issues. The chart 322, with reference to the prior art method 300 and temperature status control actions discussed above, illustrates this phenomenon. The chart 322 includes a plurality of rows separate into three columns—a temperature determined (e.g., the "current temperature" of the IHS 204 discussed above), a temperature status reported by the IHS 204 in response to the determined temperature passing a threshold, and a fan speed (in % PWM) that results when that temperature status is reported to the chassis management controller 210.

With reference to the chart 322 beginning at the first row, the IHS 204 is shown in a situation in which the determined temperature is 68° C., 69° C., and 70° C. (i.e., the current temperature of the IHS 204 is determined to be greater than 50° C. and less than or equal to 70° C. at decision block 306) in successive iterations of the prior art method 300, which provides for a reported second temperature status ("TEMP STATUS 2") at block 314. In response the reported second temperature status, the chassis management controller 210 makes no changes to the fan speed of the fans 216 in any of those iterations, providing for a fan speed of 30% PWM in the illustrated embodiment.

The IHS 204 then determines temperatures of 71° C. and 72° C. (i.e., the current temperature of the IHS 204 is determined to be greater than 70° C. and less than or equal to 80° C. at decision block 308) in successive iterations of the prior art method 300, which provides for a reported third temperature status ("TEMP STATUS 3") at block 316 when the determined temperature passes the 70° C. threshold. In response to the reported third temperature status, the chassis management controller 210 increases the fan speed of the fans 216 by 5% every 5 seconds, providing for an increase in the fan speeds to 35% PWM and 50% PWM in the illustrated embodiment.

The IHS 204 then determines a temperature of 72° C. (i.e., the current temperature of the IHS 204 is determined to be greater than 70° C. and less than or equal to 80° C. at decision block 308) in the following iteration of the prior art method 300, which provided for a reported third temperature status ("TEMP STATUS 3"). In response, the chassis management controller 210 continues to increase the fan speed of the fans 216 by 5% every 5 seconds, providing for a fan speed of 70% PWM in the illustrated embodiment. The IHS 204 then determines a temperature of 71° C. (i.e., the current temperature of the IHS 204 is determined to be greater than 70° C. and less than or equal to 80° C. at decision block 308) in the following iteration of the prior art method 300, which provides for the reported third temperature status ("TEMP STATUS 3") at block 316. In response to the reported third temperature status, the chassis management controller 210 increases the fan speed of the fans 216 by 5% every 5 seconds, providing for a fan speed of 100% PWM in that iteration in the illustrated embodiment. Thus, while the temperature of the IHS 204 stabilized (i.e., at 72° C.) and then began to decrease (i.e., from at 72° C. to 71° C.), the prior art method 300 has resulted in the increasing of the fan speed of the fans 216 from 70% PWM to 100% PWM.

The chart 322 then illustrates how in successive iterations of the prior art method 300 the IHS 204 determines temperatures between 70° C. and 51° C. (i.e., the current temperature of the IHS 204 is determined to be greater than 50° C. and less than or equal to 70° C. at decision block 306), which provides for a reported second temperature status ("TEMP STATUS 2") at block 314 when the determined temperature passed the 70° C. threshold. In response to the reported second temperature status, the chassis management controller 210 makes no changes to the fan speed of the fans 216, providing for a fan speed of 100% PWM throughout that temperature range in the illustrated embodiment.

The IHS 204 then goes on to determine temperatures of 50° C., 49° C., and 48° C. (i.e., the current temperature of the IHS 204 is determined to be less than or equal to 50° C. at decision block 304) in successive iterations of the prior art method 300, which provides for a reported first temperature status ("TEMP STATUS 1") at block 312 when the determined temperature passed the 50° C. threshold. In response to the reported first temperature status, the chassis management controller 210 decreases the fan speed of the fans 216 by 4% every 20 seconds, providing for fan speeds of 96% PWM, 80% PWM, and 60% PWM in each successive iteration in the illustrated embodiment.

The IHS 204 then determines temperatures of 49° and 50° C. (i.e., the current temperature of the IHS 204 is determined to be less than or equal to 50° C. at decision block 304) in successive iterations of the prior art method 300, which provides for the reported first temperature status ("TEMP STATUS 1") at block 312. In response to the reported first temperature status, the chassis management controller 210 continues to decrease the fan speed of the fans 216 by 4% every 20 seconds, providing for fan speeds of 40% PWM and 30% PWM in the illustrated embodiment. Thus, while the temperature of the IHS 204 is increasing (i.e., from 48° C. to 50° C.), the prior art method 300 has continued to decrease the fan speed of the fans 216 from 60% PWM to 30% PWM. The IHS 204 then determines a temperature of 51° C. (i.e., the current temperature of the IHS 204 is determined to be greater than 50° C. and less than or equal to 70° C. at decision block 306), which provides for a reported second temperature status ("TEMP STATUS 2") at block 314 when the determined temperature passed the 50° C. threshold. In response to the reported second temperature status, the chassis management controller 210 makes no changes to the fan speed of the fans 216, providing for a fan speed of 30% PWM in successive iterations in the illustrated embodiment until the IHS 204 again passes the 70° C. threshold or the 50° C. threshold.

As can be seen, the prior art method 300 results in oscillations of the fan speed that may cause the cooling system to provide too much cooling (e.g., extended periods of fan speeds of 100% PWM in the illustrated embodiment), too little cooling (e.g., extended periods of fan speeds of 30% PWM in the illustrated embodiment), and/or may result in a variety of other cooling system oscillations known in the art. The present disclosure provides for control of the cooling system based on temperature trends of the IHS 204, rather than the passing of temperature thresholds that result in the deficiencies provided by the prior art method 300 discussed above.

Figure 4A:
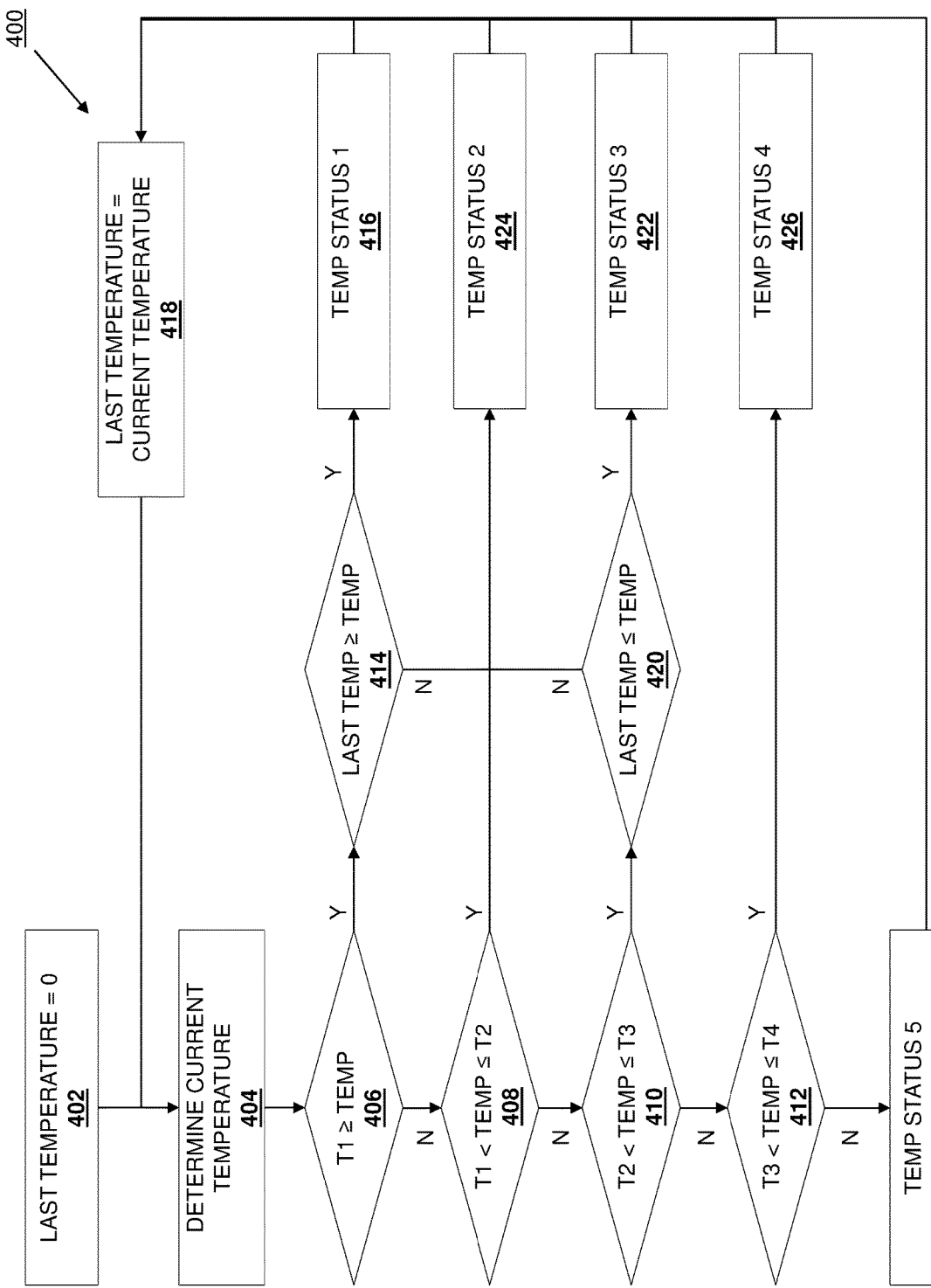
FIG. 4a is a flow chart illustrating an embodiment of a method for providing temperature control according to the teachings of the present disclosure.

Referring now to FIG. 4a, an embodiment of a method 400 for providing temperature control according to the teachings of the present disclosure is illustrated. In some embodiments, the method 400 may be performed by each of the IHSs 204 and result in the control of all of the fans 216 by the chassis management controller 210. For example, each of the IHSs 204 may perform the method 400 to send a respective temperature status to the chassis management controller 210, and the chassis management controller 210 may control all of the fans 216 based on the temperature status that indicates the highest temperature in any of the IHSs 204. In other examples, the chassis management controller 210 may control subsets of the fans 216 based on the temperature statuses received from subsets of the IHSs 204. In other embodiments, the method 400 may be performed by each of the IHSs 204 and result in the control of a respective fan 216 or set of fans 216 by the chassis management controller 210. For example, each IHS 204 may be associated with a respective fan 216 that controls the cooling for that IHS 204, and the chassis management controller 210 may control that fan 216 based on the temperature status received from that IHS 204. While a few examples have been provided, any combinations of IHSs, fans, and the control of fans using signals from IHSs is envisioned as falling within the scope of the present disclosure. Furthermore, while the method 400 is described below as being performed by a single IHS 204, each of the IHSs 204 may perform the method 400 at substantially the same time while remaining within the scope of the present disclosure.

The method begins at block 402 where a last temperature is set at 0. In an embodiment, the IHS 204 includes a database or other memory structure in which a last temperature may be stored, and at block 402, the temperature status reporting engine 206 in the IHS 204 stores a last temperature of 0° C. In other embodiments, the last temperature stored at block 402 may be temperatures other than 0° C., which may be selected by a user, administrator, manufacturer, or other entity. The method 400 then proceeds to block 404 where a current temperature is determined. In an embodiment, the temperature status reporting engine 206 in the IHS 204 retrieves or receives a temperature measured by the temperature sensor 208 in that IHS 204 to determine the current temperature at block 404. As discussed above, the current temperature determined at block 404 may be a current temperature of the IHS 204, a current temperature of a component of the IHS 204, and/or any current temperature that is indicative of the current thermal conditions experienced by the IHS 204. Furthermore, the current temperature determined at block 404 may be an average temperature in IHS 204, the highest temperature component in the IHS 204, and/or any other temperature of the IHS 204 that is known in the art to dictate the cooling requirements of an IHS.

The method 400 then proceeds to decision block 406 where it is determined whether the current temperature is in a first temperature range (e.g., less than or equal a first temperature T1 in the illustrated embodiment). In an embodiment, the temperature status reporting engine 206 in the IHS 204 compares the current temperature to a first predetermined temperature range that is provided in a database or other memory structure. For example, at decision block 406, the temperature status reporting engine 206 may determine whether the current temperature is less than or equal to 50° C. If at decision block 406 it is determined that the current temperature is not in the first temperature range, the method 400 proceeds to decision block 408 where it is determined whether the current temperature is in a second temperature range (e.g., greater than the first temperature T1 but less than or equal to a second temperature T2 in the illustrated embodiment). In an embodiment, the temperature status reporting engine 206 in the IHS 204 compares the current temperature to a second predetermined temperature range that is provided in a database or other memory structure. For example, at decision block 408, the temperature status reporting engine 206 may determine whether the current temperature is greater than 50° C. and less than or equal to 70° C. If at decision block 408 it is determined that the current temperature is not in the second temperature range, the method 400 proceeds to decision block 410 where it is determined whether the current temperature is in a third temperature range (e.g., greater than the second temperature T2 but less than or equal to a third temperature T3 in the illustrated embodiment). In an embodiment, the temperature status reporting engine 206 in the IHS 204 compares the current temperature to a third predetermined temperature range that is provided in a database or other memory structure. For example, at decision block 408, the temperature status reporting engine 206 may determine whether the current temperature is greater than 70° C. and less than or equal to 80° C. If at decision block 410 it is determined that the current temperature is not in the third temperature range, the method 400 proceeds to decision block 412 where it is determined whether the current temperature is in a fourth temperature range (e.g., greater than the third temperature T3 but less than or equal to a fourth temperature T4 in the illustrated embodiment). In an embodiment, the temperature status reporting engine 206 in the IHS 204 compares the current temperature to a fourth predetermined temperature range that is provided in a database or other memory structure. For example, at decision block 408, the temperature status reporting engine 206 may determine whether the current temperature is greater than 80° C. and less than or equal to 85° C.

The method 400 includes a plurality of temperature statuses that may be similar to the temperature statuses used in the prior art method 300 discussed above. In the embodiments discussed below, the specific examples provided for the first temperature T1, the second temperature T2, the third temperature T3, the fourth temperature T4, and the temperature statuses used in the method 400 are the same as those used in the prior art method 300 in order to illustrate the differences in the results of operation of the IHS temperature control system 200 according to the two methods. However, the first temperature T1, the second temperature T2, the third temperature T3, the fourth temperature T4, and the temperature statuses used in the 400 may be modified based on the IHSs, IHS components, or any other heat producing devices that would benefit from the teachings of the present disclosure.

If, at decision block 406, it is determined that the current temperature is in the first temperature range (e.g., less than or equal the first temperature T1 in the illustrated embodiment), the method 400 proceeds to decision block 414 where an IHS temperature trend is determined. In the illustrated embodiment, the IHS temperature trend of the IHS 204 is determined at decision block 414 by determining whether the current temperature and the last temperature indicate that the temperature of the IHS 204 is increasing or not increasing. In an embodiment, the temperature status reporting engine 208 in the IHS 204 compares the current temperature determined at block 404 to a last temperature (e.g., the last temperature set at block 402, a temperature determined during a previous iteration of the method 400, etc.) to determine whether the temperature of the IHS 204 is increasing or not increasing (e.g., whether the current temperature is less than or equal to the last temperature in the illustrated embodiment). As discussed in further detail below, the determination of the IHS temperature trend at decision block 414 operates to help prevent the cooling system oscillations associated with the prior art method 300. If, at decision block 414, it is determined that the current temperature and the last temperature indicate that the temperature of the IHS 204 is not increasing, the method 400 proceeds to block 416 where a decrease cooling signal that corresponds to a below normal temperature reading is provided by the IHS 204 to the chassis management controller 210. In an embodiment, the temperature status reporting engine 208 provides the decrease cooling signal (e.g., the first temperature status "TEMP STATUS 1") to the temperature control engine 212 in the chassis management controller 210 (e.g., upon the current temperature passing the T1 temperature threshold, during each iteration of the method 400 in which the current temperature is in the first predetermined temperature range, etc.), and in response to provision of the decrease cooling signal, the temperature control engine 212 is configured to send a signal to the fan controller(s) in the fan(s) 216 that, for example, operates to decrease the fan speed of the fan(s) 216 by 4% every 20 seconds. The method 400 then proceeds to block 418 where the current temperature determined during that iteration of the method 400 is saved as the last temperature (e.g., in a database or other memory structure in the IHS 204), and then back to block 404 to start the next iteration of the method 400.

If, at decision block 410, it is determined that the current temperature is in the third temperature range (e.g., greater than the second temperature T2 and less than or equal the third temperature T3 in the illustrated embodiment), the method 400 proceeds to decision block 420 where an IHS temperature trend is determined. In the illustrated embodiment, the IHS temperature trend of the IHS 204 is determined at decision block 420 by determining whether the current temperature and the last temperature indicate that the temperature of the IHS 204 is decreasing or not decreasing. In an embodiment, the temperature status reporting engine 208 in the IHS 204 compares the current temperature determined at block 404 to a last temperature (e.g., the last temperature set at block 402, a temperature determined during a previous iteration of the method 400, etc.) to determine whether the temperature of the IHS 204 is decreasing or not decreasing (e.g., whether the current temperature is greater than or equal to the last temperature in the illustrated embodiment). As discussed in further detail below, the determination of the IHS temperature at decision block 420 operates to help prevent the cooling system oscillations associated with the prior art method 300. If, at decision block 420, it is determined that the current temperature and the last temperature indicate that the temperature of the IHS 204 is not decreasing, the method 400 proceeds to block 422 where a first increase cooling signal that corresponds to a warning temperature reading is provided by the IHS 204 to the chassis management controller 210. In an embodiment, the temperature status reporting engine 208 provides the first increase cooling signal (e.g., the third temperature status "TEMP STATUS 3") to the temperature control engine 212 in the chassis management controller 210 (e.g., upon the current temperature passing the T2 temperature threshold, during each iteration of the method 400 in which the current temperature is in the third predetermined temperature range, etc.), and in response to that first increase cooling signal, the temperature control engine 212 is configured to send a signal to the fan controller(s) in the fan(s) 216 that, for example, operates to increase the fan speed of the fan(s) 216 by 5% every 5 seconds. The method 400 then proceeds to block 418 where the current temperature is saved as the last temperature as described above, and then back to block 404 to start the next iteration of the method 400.

If, at decision block 408, it is determined that the current temperature is in the second temperature range (e.g., greater than the first temperature T1 and less than or equal the second temperature T2 in the illustrated embodiment), or if at decision block 414 it is determined that the current temperature and the last temperature indicate that the temperature of the IHS 204 is increasing (e.g., the current temperature is greater than the last temperature in the illustrated embodiment), or if at decision block 420 it is determined that the current temperature and the last temperature indicate that the temperature of the IHS 204 is decreasing (e.g., the current temperature is less than the last temperature in the illustrated embodiment), the method 400 proceeds to block 424 where maintain cooling signal that corresponds to a normal temperature reading is provided by the IHS 204 to the chassis management controller 210. In an embodiment, the temperature status reporting engine 208 provides the maintain cooling signal (e.g., the second temperature status "TEMP STATUS 2") to the temperature control engine 212 in the chassis management controller 210 (e.g., upon the current temperature passing the T1 or T2 temperature thresholds, during each iteration of the method 400 in which the current temperature is in the second predetermined temperature range, etc.), and in response to that maintain cooling signal, the temperature control engine 212 is configured to make no changes to the fan speed of the fan(s) 216.

As discussed in further detail below, the sending of the maintain cooling signal in response to determining at decision blocks 406 and 414 that the current temperature is in the first predetermined temperature range and the IHS temperature trend is increasing, or in response to determining at decision blocks 410 and 420 that the current temperature is in the third temperature range and the IHS temperature trend is decreasing, helps to prevent the cooling system oscillations associated with the prior art method 300. The method 400 then proceeds to block 418 where the current temperature is saved as the last temperature as described above, and then back to block 404 to start the next iteration of the method 400.

If, at decision block 412, it is determined that the current temperature is in the fourth temperature range (e.g., greater than the third temperature T3 and less than or equal the fourth temperature T4 in the illustrated embodiment), the method 400 proceeds to block 426 where a second increase cooling signal that corresponds to a critical temperature reading is provided by the IHS 204 to the chassis management controller 210. In an embodiment, the temperature status reporting engine 208 provides the second increase cooling signal (e.g., the fourth temperature status "TEMP STATUS 4") to the temperature control engine 212 in the chassis management controller 210 (e.g., upon the current temperature passing the T3 temperature threshold, during each iteration of the method 400 in which the current temperature is in the fourth predetermined temperature range, etc.), and in response to that second increase cooling signal, the temperature control engine 212 is configured to increase the fan speed of the fan(s) 216 by 20% every 5 seconds. As such, the second increase cooling signal provides a second level of increased cooling that is greater than a first level of increased cooling provided by the first increase cooling signal discussed above. The method 400 then proceeds to block 418 where the current temperature is saved as the last temperature as described above, and then back to block 404 to start the next iteration of the method 400.

If, at decision block 412, it is determined that the current temperature is not the fourth temperature range (i.e., its current temperature is greater than the fourth temperature T4), the method 400 proceeds to block 428 where an IHS shutdown signal that corresponds to a shutdown temperature reading is provided by the IHS 204 to the chassis management controller 210. In an embodiment, the temperature status reporting engine 208 provides the IHS shutdown signal (e.g., the fifth temperature status "TEMP STATUS 5") to the temperature control engine 212 in the chassis management controller 210 (e.g., upon the current temperature passing the T4 temperature threshold, during each iteration of the method 400 in which the current temperature is greater than the fourth predetermined temperature range, etc.), and in response to that IHS shutdown signal, the temperature control engine 212 is configured to send a signal to shut down the IHS 204. The method 400 then proceeds to block 418 where the current temperature is saved as the last temperature as described above, and then back to block 404 to start the next iteration of the method 400.

Referring now to FIG. 4b, a chart 430 is provided to illustrate how the operation of the IHS temperature control system 200 according to the method 400 of FIG. 4a remedies the issues associated with the prior art method 300 discussed above. The chart 430, with reference to the method 400 and temperature status control actions discussed above, is provided to illustrate the difference in fan speed behavior during the method 400 over the same temperature profile discussed in chart 322. For ease of comparison, T1, T2, T3, and T4 of the method 400 are provided as 50° C., 70° C., 80° C., and 85° C., respectively, to correspond to the temperatures discussed above for the prior art method 300. The chart 430 includes a plurality of rows separated into three columns—a temperature determined (e.g., the "current temperature" of the IHS 204 discussed above), a temperature status provided by the IHS 204 in response to the temperature determined, and a fan speed (in % PWM) that results when the temperature status is provided to chassis management controller 210.

With reference to the chart 430 beginning at the first row, the IHS 204 is shown in a situation in which the temperature determined is 68° C., 69° C., and 70° C. (i.e., the current temperature of the IHS 204 is determined to be greater than 50° C. and less than or equal to 70° C. at decision block 410) in successive iterations of the method 400, which results in the provision of the second temperature status ("TEMP STATUS 2") at block 424. In response, the chassis management controller 210 makes no changes to the fan speed of the fans 216, providing for a fan speed of 30% PWM in the illustrated embodiment.

The IHS 204 then determines temperatures of 71° C. and 72° C. (i.e., the current temperature of the IHS 204 is determined to be greater than 70° C. and less than or equal to 80° C. at decision block 410) in successive iterations of the method 400, which results in a determination, at decision block 420 for each iteration, of whether the current temperature and the last temperature indicate that the temperature of the IHS is not decreasing. Because each of those temperatures (71° C. and 72° C). indicate that the temperature of the IHS 204 is not decreasing (from 70° C. and 71° C., respectively), the determination at decision block 420 in each of those cases results in the provision of the third temperature status ("TEMP STATUS 3") to the chassis management controller 210. In response to the provision of the third temperature status, the chassis management controller 210 increases the fan speed of the fans 216 by 5% every 5 seconds, providing for a fan speeds of 35% PWM and 50% PWM in the illustrated embodiment.

The IHS 204 then determines a temperature of 72° C. (i.e., the current temperature of the IHS 204 is determined to be greater than 70° C. and less than or equal to 80° C. at decision block 410) in the following iteration of the method 400, which results in a determination, at decision block 420, of whether the current temperature and the last temperature indicate that the temperature of the IHS is not decreasing. Because that temperature (72° C.) indicates that the temperature of the IHS 204 is not decreasing (from the previous temperature of 72° C.), the determination at decision block 420 results in the provision of the third temperature status ("TEMP STATUS 3") to the chassis management controller 210. In response to the provision of the third temperature status, the chassis management controller 210 increases the fan speed of the fans 216 by 5% every 5 seconds, providing for a fan speeds of 80% PWM in the illustrated embodiment.

The IHS 204 then determines a temperature of 71° C. (i.e., the current temperature of the IHS 204 is determined to be greater than 70° C. and less than or equal to 80° C. at decision block 410) in the following iteration of the method 400, which results in a determination, at decision block 420, of whether the current temperature and the last temperature indicate that the temperature of the IHS is not decreasing. Because that temperature (71° C.) indicates that the temperature of the IHS 204 is decreasing (from the previous temperature of 72° C.), the determination at decision block 420 results in the provision of the second temperature status ("TEMP STATUS 2") to the chassis management controller 210. In response to the provision of the second temperature status, the chassis management controller 210 makes no changes to the fan speed of the fans 216, providing for a fan speed of 80% PWM in the illustrated embodiment. Thus, the determination at blocks 410 and 420 that the temperature of the IHS 204 is in an elevated range, but the IHS temperature trend of the IHS 204 is decreasing towards a normal range, results in no more increases in fan speed from 80% PWM.

The chart 430 then illustrates how in successive iterations of the method 400 the IHS 204 determines temperatures between 70° C. and 51° C. (i.e., the current temperature of the IHS 204 is determined to be greater than 50° C. and less than or equal to 70° C. at decision block 408), which results in the provision of the second temperature status ("TEMP STATUS 2") to the chassis management controller 210. In response to the provision of the second temperature status, the chassis management controller 210 makes no changes to the fan speed of the fans 216, providing for a fan speed of 80% PWM in that temperature range in the illustrated embodiment.

The IHS 204 then goes on to determine temperatures of 50° C., 49° C., and 48° C. (i.e., the current temperature of the IHS 204 is determined to be less than or equal to 50° C. at decision block 406) in successive iterations of the method 400, which results in a determination, at decision block 414, of whether the current temperature and the last temperature indicate that the temperature of the IHS is not increasing. Because those temperatures (50° C., 49° C., and 48° C.) indicate that the temperature of the IHS 204 is not increasing (from 51° C., 50° C., and 49° C., respectively), the determination at decision block 414 results in the provision of the first temperature status ("TEMP STATUS 1") to the chassis management controller 210. In response to the provision of the first temperature status, the chassis management controller 210 decreases the fan speed of the fans 216 by 4% every 20 seconds, providing for fan speeds of 76% PWM, 60% PWM, and 48% PWM in of the illustrated embodiment.

The IHS 204 then determines temperatures of 49° and 50° C. (i.e., the current temperature of the IHS 204 is determined to be less than or equal to 50° C. at decision block 406) in successive iterations of the method 400, which results in a determination, at decision block 414, of whether the current temperature and the last temperature indicate that the temperature of the IHS is not increasing. Because those temperatures (49° and 50° C). indicate that the temperature of the IHS 204 is increasing (from 48° C. and 49° C., respectively), the determination at decision block 414 results in the provision of the second temperature status ("TEMP STATUS 2") to the chassis management controller 210. In response to the provision of the second temperature status, the chassis management controller 210 makes no changes to the fan speed of the fans 216, providing for a fan speed of 48% PWM in each successive iteration in of the illustrated embodiment. Thus, the determination at blocks 406 and 414 that the temperature of the IHS 204 is in a below normal range, and that the IHS temperature trend of the IHS 204 is increasing towards a normal range, results in no more decreases in fan speed from 48% PWM.

The IHS 204 then determines a temperature of 51° C. (i.e., the current temperature of the IHS 204 is determined to be greater than 50° C. and less than or equal to 70° C. at decision block 408), which results in the provision of the second temperature status ("TEMP STATUS 2") to the chassis management controller 210. In response to the provision of the second temperature status, the chassis management controller 210 makes no changes to the fan speed of the fans 216, providing for a fan speed of 48% PWM in successive iterations in the illustrated embodiment until the IHS 204 again determines its temperature is again in the third temperature range or the first temperature range.

As can be seen, the method 400 reduces the amplitude of the oscillations of the fan speed provided in the prior art method 300 that cause the cooling system to provide too much cooling (e.g., reducing extended periods of fan speeds of 100% PWM to 80% PWM in the illustrated embodiment) and too little cooling (e.g., reducing extended periods of fan speeds of 30% PWM to 48% PWM in the illustrated embodiment). Thus, the present disclosure provides for control of the cooling system based on temperature trends of the IHS 204, rather than the passing of temperature thresholds that result in the deficiencies provided by the prior art method 300 discussed above.

Figure 4C:
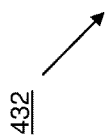

Referring now to FIG. 4c, a chart 432 is provided to illustrate the operation of the IHS temperature control system 200 according to the method 400 of FIG. 4a. For ease of comparison, T1, T2, T3, and T4 of the method 400 are provided as 50° C., 70° C., 80° C., and 85° C., respectively, to correspond to the temperatures discussed above for the prior art method 300. The chart 430 includes a plurality of rows separated into three columns—a temperature determined (e.g., the "current temperature" of the IHS 204 discussed above), a temperature status provided by the IHS 204 in response to the temperature determined, and a fan speed (in % PWM) that results when the temperature status is provided to the chassis management controller 210.

With reference to the chart 432 beginning at the first row, the IHS 204 is shown in a situation in which the temperature determined is 68° C., 69° C., and 70° C. (i.e., the current temperature of the IHS 204 is determined to be greater than 50° C. and less than or equal to 70° C. at decision block 410) in successive iterations of the method 400, which results in the provision of the second temperature status ("TEMP STATUS 2") to the chassis management controller 210. In response to the provision of the second temperature status, the chassis management controller 210 makes no changes to the fan speed of the fans 216, providing for a fan speed of 30% PWM in the illustrated embodiment.

The IHS 204 then determines temperatures of 71° C. and 72° C. (i.e., the current temperature of the IHS 204 is determined to be greater than 70° C. and less than or equal to 80° C. at decision block 410) in successive iterations of the method 400, which results in a determination, at decision block 420 for each iteration, of whether the current temperature and the last temperature indicate that the temperature of the IHS is not decreasing. Because each of those temperatures (71° C. and 72° C). indicate that the temperature of the IHS 204 is not decreasing (from 70° C. and 71° C., respectively), the determination at decision block 420 in each of those cases results in the provision of the third temperature status ("TEMP STATUS 3") to the chassis management controller 210. In response to the provision of the third temperature status, the chassis management controller 210 increases the fan speed of the fans 216 by 5% every 5 seconds, providing for a fan speeds of 35% PWM and 50% PWM in the illustrated embodiment.

The IHS 204 then determines a temperature of 72° C. (i.e., the current temperature of the IHS 204 is determined to be greater than 70° C. and less than or equal to 80° C. at decision block 410) in the following iteration of the method 400, which results in a determination, at decision block 420, of whether the current temperature and the last temperature indicate that the temperature of the IHS is not decreasing. Because that temperature (72° C.) indicates that the temperature of the IHS 204 is not decreasing (from the previous temperature of 72° C.), the determination at decision block 420 results in the provision of the third temperature status ("TEMP STATUS 3") to the chassis management controller 210. In response to the provision of the third temperature status, the chassis management controller 210 increases the fan speed of the fans 216 by 5% every 5 seconds, providing for a fan speed of 70% PWM in the illustrated embodiment.

The IHS 204 then determines a temperature of 71° C. (i.e., the current temperature of the IHS 204 is determined to be greater than 70° C. and less than or equal to 80° C. at decision block 410) in the following iteration of the method 400, which results in a determination, at decision block 420, of whether the current temperature and the last temperature indicate that the temperature of the IHS is not decreasing. Because that temperature (71° C.) indicates that the temperature of the IHS 204 is decreasing (from the previous temperature of 72° C.), the determination at decision block 420 results in the provision of the second temperature status ("TEMP STATUS 2") to the chassis management controller 210. In response to the provision of the second temperature status, the chassis management controller 210 makes no changes to the fan speed of the fans 216, providing for a fan speed of 70% PWM in the illustrated embodiment. Thus, the determination at blocks 410 and 420 that the temperature of the IHS 204 is in an elevated range, but the IHS temperature trend of the IHS 204 is decreasing towards a normal range, results in no more increases in fan speed from 70% PWM.

The IHS 204 then determines a temperature of 72° C. (i.e., the current temperature of the IHS 204 is determined to be greater than 70° C. and less than or equal to 80° C. at decision block 410) in the following iteration of the method 400, which results in a determination, at decision block 420, of whether the current temperature and the last temperature indicate that the temperature of the IHS is not decreasing. Because that temperature (72° C.) indicates that the temperature of the IHS 204 is not decreasing (from the previous temperature of 71° C.), the determination at decision block 420 results in the provision of the third temperature status ("TEMP STATUS 3") to the chassis management controller 210. In response to the provision of the third temperature status, the chassis management controller 210 increases the fan speed of the fans 216 by 5% every 5 seconds, providing for a fan speed of 75% PWM in the illustrated embodiment. Thus, following a determination in a previous iteration of the method 400 that the IHS 204 has a current temperature that is in an elevated range but an IHS temperature trend that is decreasing towards a normal range, an increase in the current temperature away from the normal range will result in an increase in fan speed (e.g., from 70% PWM to 75% PWM in the illustrated embodiment).

The IHS 204 then determines temperatures of 73° C. and 74° C. (i.e., the current temperature of the IHS 204 is determined to be greater than 70° C. and less than or equal to 80° C. at decision block 410) in successive iterations of the method 400, which results in a determination, at decision block 420 for each iteration, of whether the current temperature and the last temperature indicate that the temperature of the IHS is not decreasing. Because each of those temperatures (73° C. and 74° C.) indicate that the temperature of the IHS 204 is not decreasing (from 72° C. and 73° C., respectively), the determination at decision block 420 in each of those cases results in the provision of the third temperature status ("TEMP STATUS 3") to the chassis management controller 210. In response to the provision of the third temperature status, the chassis management controller 210 increases the fan speed of the fans 216 by 5% every 5 seconds, providing for fan speeds of 90% PWM and 95% PWM in the illustrated embodiment.

The IHS 204 then determines temperatures of 73° C., 72° C., and 71° C. (i.e., the current temperature of the IHS 204 is determined to be greater than 70° C. and less than or equal to 80° C. at decision block 410) in the following iterations of the method 400, which results in a determination, at decision block 420, of whether the current temperature and the last temperature indicate that the temperature of the IHS is not decreasing. Because that temperatures (73° C., 72° C., and 71° C.) indicate that the temperature of the IHS 204 is decreasing (from the previous temperatures of 74° C., 73° C., and 72° C., respectively), the determination at decision block 420 results in the provision of the second temperature status ("TEMP STATUS 2") to the chassis management controller 210. In response to the provision of the second temperature status, the chassis management controller 210 makes no changes to the fan speed of the fans 216, providing for fan speeds of 95% PWM in the illustrated embodiment. Thus, the determination at blocks 410 and 420 that the temperature of the IHS 204 is in an elevated range, but an IHS temperature trend of the IHS 204 is decreasing towards a normal range, results in no more increases in fan speed from 95% PWM.

The chart 430 then illustrates how in successive iterations of the method 400 the IHS 204 determine temperatures between 70° C. and 51° C. (i.e., the current temperature of the IHS 204 is determined to be greater than 50° C. and less than or equal to 70° C. at decision block 408), which results in the provision of the second temperature status ("TEMP STATUS 2") to the chassis management controller 210. In response to the provision of the second temperature status, the chassis management controller 210 makes no changes to the fan speed of the fans 216, providing for fan speeds of 95% PWM in the illustrated embodiment.

The IHS 204 then goes on to determine temperatures of 50° C., 49° C., 48° C., 47° C., and 46° C. (i.e., the current temperature of the IHS 204 is determined to be less than or equal to 50° C. at decision block 406) in successive iterations of the method 400, which result in a determination, at decision block 414, of whether the current temperature and the last temperature indicate that the temperature of the IHS is not increasing. Because those temperatures (50° C., 49° C., 48° C., 47° C., and 46° C.) indicate that the temperature of the IHS 204 is not increasing (from 51° C., 50° C., 49° C., 48° C., and 47° C. respectively), the determination at decision block 414 results in the provision of the first temperature status ("TEMP STATUS 1") to the chassis management controller 210. In response to the provision of the first temperature status, the chassis management controller 210 decreases the fan speed of the fans 216 by 4% every 20 seconds, providing for fan speeds of 75% PWM, 59% PWM, 55% PWM, 51% PWM, and 47% PWM in of the illustrated embodiment.

The IHS 204 then determines temperatures of 47° and 48° C. (i.e., the current temperature of the IHS 204 is determined to be less than or equal to 50° C. at decision block 406) in successive iterations of the method 400, which result in a determination, at decision block 414, of whether the current temperature and the last temperature indicate that the temperature of the IHS is not increasing. Because those temperatures (47° and 48° C.) indicate that the temperature of the IHS 204 is increasing (from 46° C. and 47° C., respectively), the determination at decision block 414 results in the provision of the second temperature status ("TEMP STATUS 2") to the chassis management controller 210. In response to the provision of the second temperature status, the chassis management controller 210 makes no changes to the fan speed of the fans 216, providing for a fan speed of 47% PWM in the illustrated embodiment. Thus, the determination at blocks 406 and 414 that the temperature of the IHS 204 is in a below normal range, but an IHS temperature trend of the IHS 204 is increasing towards a normal range, results in no more decreases in fan speed from 47% PWM. Thus, following a determination in a previous iteration of the method 400 that the IHS 204 has a current temperature that is in a below average range but has a temperature trend that is decreasing away from a normal range, an increase in the current temperature towards the normal range will result in no further decreases in fan speed (e.g., holding the fan speed at 47% PWM in the illustrated embodiment).

The IHS 204 then goes on to determine temperatures of 47° C. and 46° C. (i.e., the current temperature of the IHS 204 is determined to be less than or equal to 50° C. at decision block 406) in successive iterations of the method 400, which results in a determination, at decision block 414, of whether the current temperature and the last temperature indicate that the temperature of the IHS is not increasing. Because those temperatures (47° C. and 46° C.) indicate that the temperature of the IHS 204 is not increasing (from 48° C. and 47° C. respectively), the determination at decision block 414 results in the provision of the first temperature status ("TEMP STATUS 1") to the chassis management controller 210. In response to the provision of the first temperature status, the chassis management controller 210 decreases the fan speed of the fans 216 by 4% every 20 seconds, providing for fan speeds of 43% PWM and 39% PWM in the illustrated embodiment. Thus, following a determination in a previous iteration of the method 400 that the IHS 204 has a current temperature that is in below average range and an IHS temperature trend that is increasing towards the normal range that results in no further decreases in fan speed, a decrease in the current temperature away from the normal range will result in a decrease in fan speed (e.g., to a fan speed of 39% PWM in the illustrated embodiment).

The IHS 204 then determines temperatures of 47° C., 48° C., 49° C., and 50° C. (i.e., the current temperature of the IHS 204 is determined to be less than or equal to 50° C. at decision block 406) in successive iterations of the method 400, which results in a determination, at decision block 414, of whether the current temperature and the last temperature indicate that the temperature of the IHS is not increasing. Because those temperatures (47° C., 48° C., 49° C., and 50° C.) indicate that the temperature of the IHS 204 is increasing (from 46° C., 47° C., 48° C., and 49° C., respectively), the determination at decision block 414 results in the provision of the second temperature status ("TEMP STATUS 2") to the chassis management controller 210. In response to the provision of the second temperature status, the chassis management controller 210 makes no changes to the fan speed of the fans 216, providing for fan speeds of 39% PWM in the illustrated embodiment.

The IHS 204 then determines a temperature of 51° C. (i.e., the current temperature of the IHS 204 is determined to be greater than 50° C. and less than or equal to 70° C. at decision block 408), which results in the provision of the second temperature status ("TEMP STATUS 2") to the chassis management controller 210. In response to the provision of the second temperature status, the chassis management controller 210 makes no changes to the fan speed of the fans 216, providing for a fan speed of 39% PWM in the illustrated embodiment until the IHS 204 determines its temperature is again in the third temperature range or the first temperature range.

Similarly as discussed above, the method 400 reduces the amplitude of the oscillations of the fan speed provided in the prior art method 300 that cause the cooling system to provide too much cooling or too little cooling, while allowing for reversals in the temperature trend of the IHS after passing into any of the predetermined temperature ranges. Thus, the present disclosure provides for control of the cooling system based on temperature trends of the IHS 204, rather than the passing of temperature thresholds that result in the deficiencies provided by the prior art method 300 discussed above.

In some of the embodiments discussed above, the chassis management controller 210 may be updated with a temperature status by the IHS 204 during each iteration of the method 400. However, in embodiments where the chassis management controller 210 is only updated with a temperature status by the IHS 204 when the current temperature of the IHS 204 passes a temperature threshold, the IHS 204 may track the maximum and minimum temperatures reached by the IHS after passing outside a normal temperature range. For example, using the first temperature range (below 50° C.), the second temperature range (between 50° C. and 70° C.), and the third temperature range (between 70° C. and 80° C.) discussed above, the IHS may keep track of the minimum temperature reached after passing into the first temperature range and before passing back into the second temperature range, as well as the maximum temperature reached after passing into the third temperature range and before passing back into the second temperature range. These maximum and minimum temperatures may then be used to allow the IHS 204 determine when the temperature of the IHS has left the normal temperature range, indicated a trend towards that normal temperature range, and then reversed that trend back away from the normal temperature range without having first reentered that normal temperature range.

Figure 5:
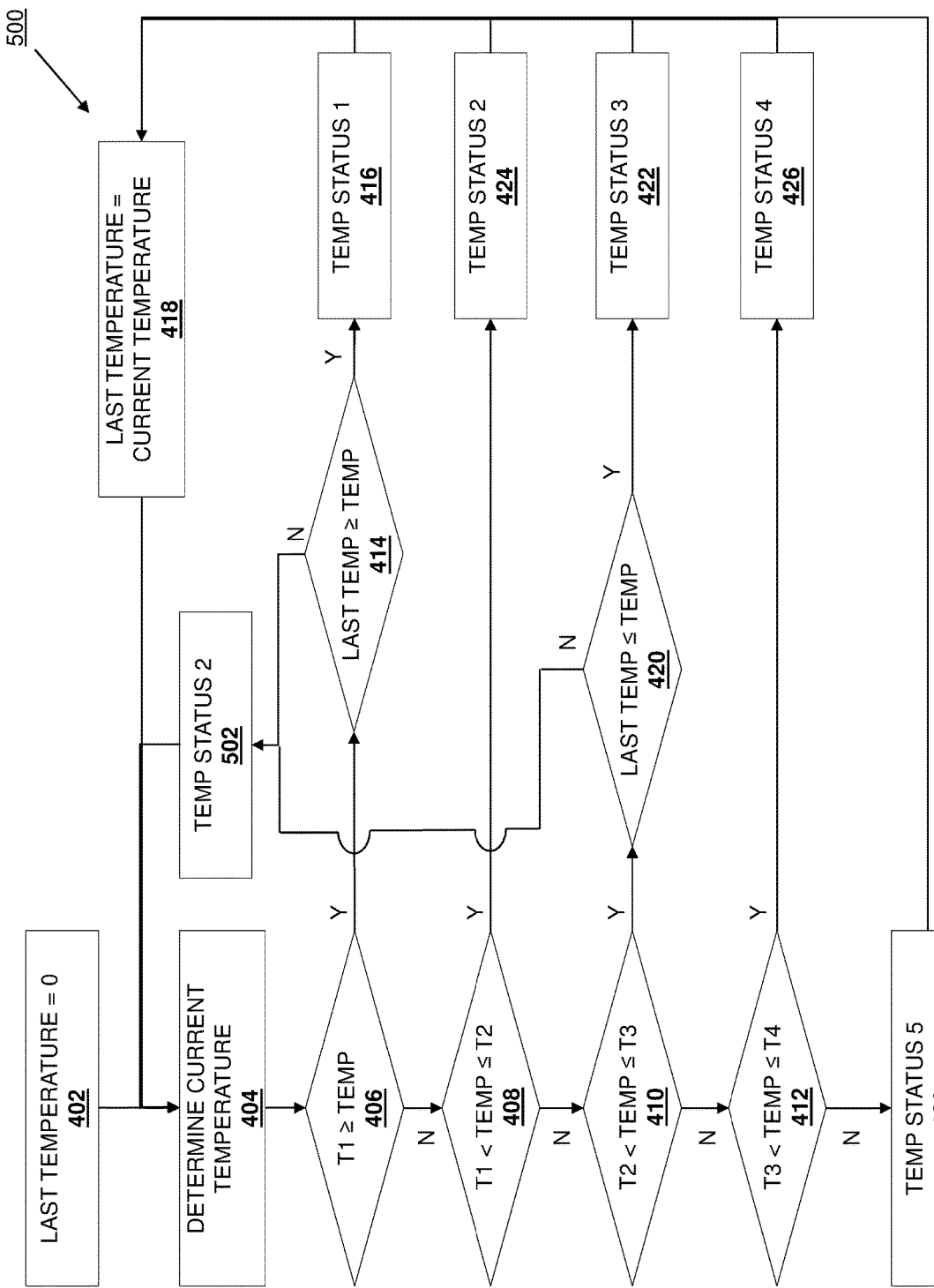
FIG. 5 is a flow chart illustrating an embodiment of a method for providing temperature control according to the teachings of the present disclosure.

For example, referring to FIG. 5, an embodiment of a method 500 for providing temperature control according to the teachings of the present disclosure is illustrated that is substantially similar to the method 400 discussed above but with a few modifications. As such, similar method blocks include similar reference numbers. As can be seen by a comparison of the methods 400 and 500, the modifications to the method 500 provide that if at decision block 414 it is determined that the current temperature and the last temperature indicate that the temperature of the IHS 204 is increasing (e.g., the current temperature is greater than the last temperature in the illustrated embodiment), or if at decision block 420 it is determined that the current temperature and the last temperature indicate that the temperature of the IHS 204 is decreasing (e.g., the current temperature is less than the last temperature in the illustrated embodiment), the method 400 proceeds to block 502 where a maintain cooling signal that corresponds to a normal temperature reading is provided by the IHS 204 to the chassis management controller 210 substantially as described above for block 424. However, in those situations, the method 500 returns to block 404 rather than updating the current temperature with the last temperature at block 418 as is performed in the method 400.

Thus, in the method 500, when the current temperature of the IHS 204 is in the below normal range (e.g., less than below 50° C.), the last temperature is updated with the current temperature as long as the current temperature and the last temperature indicate that the temperature of the IHS 204 is not increasing. When the current temperature and the last temperature then begin to indicate that the temperature of the IHS 204 is increasing (while in the below normal range), no further cooling is provided, but the last temperature is not updated. This ensures that the cooling provided by the cooling system 214 is not further decreased until the temperature of the IHS 204 drops below the lowest temperature it reached in the below normal range without leaving that below normal range.

Similarly, in the method 500, when the current temperature of the IHS 204 is in the warning range (e.g., between 70° C. and 80° C.), the last temperature is updated with the current temperature as long as the current temperature and the last temperature indicate that the temperature of the IHS 204 is increasing. When the current temperature and the last temperature then begin to indicate that the temperature of the IHS 204 is not increasing (while in the warning range), no further cooling is provided, but the last temperature is not updated. This ensures that the cooling provided by the cooling system 214 is not further increased until the temperature of the IHS 204 raises above the highest temperature it reached in the warning range without leaving that warning range.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A temperature control system, comprising:
   a temperature status reporting engine that is configured to:
   determine a first current temperature that is associated with at least one component and that is above a first temperature range;
   provide, in response to the first current temperature indicating an increasing temperature relative to a first reference temperature that is associated with the at least one component and that was measured prior to the first current temperature, an increase cooling signal and redefine the first reference temperature as the first current temperature; and
   provide, in response to the first current temperature indicating a decreasing temperature relative to the first reference temperature, a maintain cooling signal and retain the first reference temperature as the first reference temperature.

2. The temperature control system of claim 1, wherein the temperature status reporting engine is configured to:
   determine a second current temperature that is associated with the at least one component and that is below the first temperature range;
   provide, in response to the second current temperature indicating a decreasing temperature relative to a second reference temperature that is associated with the at least one component and that was measured prior to the second current temperature, a decrease cooling signal and redefine the second reference temperature as the second current temperature; and
   provide, in response to the second current temperature indicating an increasing temperature relative to the second reference temperature, a maintain cooling signal and retaining the second reference temperature as the second reference temperature.

3. The temperature control system of claim 1, wherein the temperature status reporting engine is configured to:
   determine a second current temperature that is associated with the at least one component and that is within the first temperature range and, in response, provide the maintain cooling signal.

4. The temperature control system of claim 1, wherein the first current temperature being above the first temperature range includes the first current temperature being in a second temperature range, and wherein the increase cooling signal is a first increase cooling signal that is configured to provide a first level of increased cooling.

5. The temperature control system of claim 4, wherein the temperature status reporting engine is configured to:
   determine a second current temperature that is in a third temperature range that is greater than the second temperature range and, in response, provide a second increase cooling signal that is configured to provide a second level of increased cooling that is greater than the first level of increased cooling.

6. The temperature control system of claim 5, wherein the temperature status reporting engine is configured to:
   determine a third current temperature that is above the third temperature range and, in response, provide a shutdown signal.

7. An information handling system (IHS), comprising:
   a cooling system;
   at least one device that is configured to be cooled by the cooling system;
   a processing system; and
   a memory system that includes instructions that, when executed by the processing system, cause the processing system to perform operations including:

determining a first current temperature that is associated with the at least one device and that is above a first temperature range;

in response to the first current temperature indicating an increasing temperature relative to a first reference temperature that is associated with the at least one device and that was measured prior to the first current temperature:

providing an increase cooling signal that is configured to cause the cooling system to increase cooling provided to the at least one device; and redefining the first reference temperature as the first current temperature; and in response to the first current temperature indicating a decreasing temperature relative to the first reference temperature:

providing a maintain cooling signal that is configured to cause the cooling system to maintain cooling provided to the at least one device; and retaining the first reference temperature as the first reference temperature.

8. The IHS of claim 7, wherein the operations include:
determining a second current temperature that is associated with the at least one device and that is below the first temperature range;

in response to the second current temperature indicating a decreasing temperature relative to a second reference temperature that is associated with the at least one device and that was measured prior to the second current temperature:

providing a decrease cooling signal that is configured to cause the cooling system to decrease cooling provided to the at least one device; and redefining the second reference temperature as the second current temperature; and in response to the second current temperature indicating an increasing temperature relative to the second reference temperature:

providing a maintain cooling signal that is configured to cause the cooling system to maintain cooling provided to the at least one device; and retaining the second reference temperature as the second reference temperature.

9. The IHS of claim 7, wherein the operations include:
determining a second current temperature that is associated with the at least one device and that is within the first temperature range and, in response, providing the maintain cooling signal.

10. The IHS of claim 7, wherein the first current temperature being above the first temperature range includes the first current temperature being in a second temperature range, and wherein the increase cooling signal is a first increase cooling signal that is configured to cause the cooling system to increase cooling provided to the at least one device at a first level.

11. The IHS of claim 10, wherein the operations include:
determining a second current temperature that is in a third temperature range that is greater than the second temperature range and, in response, providing a second increase cooling signal that is configured to use the cooling system to increase cooling provided to the at least one device at a second level that is greater than the first level.

12. The IHS of claim 11, wherein the operations include:
determining a third current temperature that is above the third temperature range and, in response, providing a shutdown signal that is configured to cause the at least one device to shut down.

13. The IHS of claim 7, further comprising:
a controller, wherein the at least one device includes a plurality of devices, and wherein the controller is configured to:

compare temperature control signals generated for each of the plurality of devices; and control the cooling system based on at least one of the temperature control signals that is associated with a highest temperature.

14. A method for providing temperature control, comprising:

determining, by a processing system, a first current temperature that is associated with at least one component and that is above a first temperature range;

providing, by the processing system in response to the first current temperature indicating an increasing temperature relative to a first reference temperature that is associated with the at least one component and that was measured prior to the first current temperature, an increase cooling signal and redefining the first reference temperature as the first current temperature; and providing, by the processing system in response to the first current temperature indicating a decreasing temperature relative to the first reference temperature, a maintain cooling signal and retaining the first reference temperature as the first reference temperature.

15. The method of claim 14, further comprising:
determining, by the processing system, a second current temperature that is associated with the at least one component and that is below the first temperature range;

providing, by the processing system in response to the second current temperature indicating a decreasing temperature relative to a second reference temperature that is associated with the at least one component and that was measured prior to the second current temperature, a decrease cooling signal and redefining the second reference temperature as the second current temperature; and providing, by the processing system in response to the second current temperature indicating an increasing temperature relative to the second reference temperature, a maintain cooling signal and retaining the second reference temperature as the second reference temperature.

16. The method of claim 14, further comprising:
determining, by the processing system, a second current temperature that is associated with the at least one component and that is within the first temperature range and, in response, providing the maintain cooling signal.

17. The method of claim 14, wherein the first current temperature being above the first temperature range includes the first current temperature being in a second temperature range, and wherein the increase cooling signal is a first increase cooling signal that is configured to provide a first level of increased cooling.

18. The method of claim 17, further comprising:
determining, by the processing system, a second current temperature that is in a third temperature range that is greater than the second temperature range and, in response, providing a second increase cooling signal that is configured to provide a second level of increased cooling that is greater than the first level of increased cooling.

19. The method of claim 18, further comprising:
determining, by the processing system, a third current temperature that is above the third temperature range and, in response, providing a shutdown signal.

20. The method of claim 14, wherein the at least one component includes a plurality of component, and wherein the method further comprises:
comparing, by a controller, temperature control signals generated for each of the plurality of components; and
controlling, by the controller, a cooling system based on at least one of the temperature control signals that is associated with a highest temperature.

* * * * *